United States Patent [19]

Hirose

[11] Patent Number: 4,890,286
[45] Date of Patent: Dec. 26, 1989

[54] METHOD AND APPARATUS FOR DECODING ERROR CORRECTING CODE

[75] Inventor: Shintaro Hirose, Gifu, Japan

[73] Assignee: Sanyo Electric Co., Ltd., Osaka, Japan

[21] Appl. No.: 131,922

[22] Filed: Dec. 11, 1987

[51] Int. Cl.⁴ .............................................. G06F 11/10
[52] U.S. Cl. ................................... 371/37.1; 371/37.8
[58] Field of Search ......................... 371/37, 38, 39, 40

[56] References Cited

U.S. PATENT DOCUMENTS

| | | | |
|---|---|---|---|
| 3,411,135 | 11/1968 | Watts | 371/37 |
| 3,983,536 | 9/1976 | Telfer | 371/37 |
| 4,142,174 | 2/1979 | Chen | 371/37 |
| 4,358,848 | 11/1982 | Patel | 371/39 |
| 4,397,022 | 8/1983 | Weng | 371/37 |
| 4,468,769 | 8/1984 | Koga | 371/37 |
| 4,476,562 | 10/1984 | Sako | 371/39 |
| 4,608,692 | 8/1986 | Nagumo | 371/37 |
| 4,751,704 | 6/1988 | Kojima | 371/37 |

Primary Examiner—Jerry Smith
Assistant Examiner—Robert W. Beausoliel
Attorney, Agent, or Firm—Darby & Darby

[57] ABSTRACT

A received signal train $V(X)$, to which a BCH error correcting code is added on the basis of a generator polynominal $G(X)=X^{12}+X^{10}+X^8+X^5+X^4+X^3+1$, is divided by primative polynominals $G_1(X)=X^6+X+1$ and $G_2(X)=X^6+X^4+X^2+X+1$ resulting from factorization of $G(X)$, to obtain syndromes $S_1(X)$ and $S_2(X)$ respectively. A single-bit error position $\lambda$ of the signal train $V(X)$ is obtained from a first ROM table with the address of the syndrome $S_1(X)$. Among values of the syndrome $S_2(X)$ corresponding to single-bit errors, a syndrome $S_2'(X)$ corresponding to the single-bit error position $\lambda$ is calculated from a second ROM table, to be compared with the syndrome $S_2(X)$ obtained by dividing the received signal train $V(X)$ by the primitive polynominal $G_2(X)$. Upon coincidence of the synchromes $S_2'(X)$ and $S_2(X)$, a judgement is made on a primitive error, to perform correction. Upon non-coincidence, a judgement is made on a secondary error or an error of higher degree.

15 Claims, 5 Drawing Sheets

FIG. 3

| INDEX $l$ | | VECTOR A | |
|---|---|---|---|
| DECIMAL | HEXADECIMAL | HEXADECIMAL | DECIMAL |
| 0 | 0 | 1 | 1 |
| 1 | 1 | 2 | 2 |
| 2 | 2 | 4 | 4 |
| 3 | 3 | 8 | 8 |
| 4 | 4 | 10 | 16 |
| 5 | 5 | 20 | 32 |
| 6 | 6 | 3 | 3 |
| 7 | 7 | 6 | 6 |
| 8 | 8 | C | 12 |
| 9 | 9 | 18 | 24 |
| 10 | A | 30 | 48 |
| 11 | B | 23 | 35 |
| 12 | C | 5 | 5 |
| 13 | D | A | 10 |
| 14 | E | 14 | 20 |
| 15 | F | 28 | 40 |
| 16 | 10 | 13 | 19 |
| 17 | 11 | 26 | 38 |
| 18 | 12 | F | 15 |
| 19 | 13 | 1E | 30 |
| 20 | 14 | 3C | 60 |
| 21 | 15 | 3B | 59 |
| 22 | 16 | 35 | 53 |
| 23 | 17 | 29 | 41 |
| 24 | 18 | 11 | 17 |
| 25 | 19 | 22 | 34 |
| 26 | 1A | 7 | 7 |
| 27 | 1B | E | 14 |
| 28 | 1C | 1C | 28 |
| 29 | 1D | 38 | 56 |
| 30 | 1E | 33 | 51 |
| 31 | 1F | 25 | 37 |
| 32 | 20 | 9 | 9 |
| 33 | 21 | 12 | 18 |
| 34 | 22 | 24 | 36 |
| 35 | 23 | B | 11 |
| 36 | 24 | 16 | 22 |
| 37 | 25 | 2C | 44 |
| 38 | 26 | 1B | 27 |
| 39 | 27 | 36 | 54 |
| 40 | 28 | 2F | 47 |
| 41 | 29 | 1D | 29 |
| 42 | 2A | 3A | 58 |
| 43 | 2B | 37 | 55 |
| 44 | 2C | 2D | 45 |
| 45 | 2D | 19 | 25 |
| 46 | 2E | 32 | 50 |
| 47 | 2F | 27 | 39 |
| 48 | 30 | D | 13 |
| 49 | 31 | 1A | 26 |
| 50 | 32 | 34 | 52 |
| 51 | 33 | 2B | 43 |
| 52 | 34 | 15 | 21 |
| 53 | 35 | 2A | 42 |
| 54 | 36 | 17 | 23 |
| 55 | 37 | 2E | 46 |
| 56 | 38 | 1F | 31 |
| 57 | 39 | 3E | 62 |
| 58 | 3A | 3F | 63 |
| 59 | 3B | 3D | 61 |
| 60 | 3C | 39 | 57 |
| 61 | 3D | 31 | 49 |
| 62 | 3E | 21 | 33 |

FIG. 4

| VECTOR A | | INDEX $l$ | |
|---|---|---|---|
| DECIMAL | HEXADECIMAL | HEXADECIMAL | DECIMAL |
| 1 | 1 | 0 | 0 |
| 2 | 2 | 1 | 1 |
| 3 | 3 | 6 | 6 |
| 4 | 4 | 2 | 2 |
| 5 | 5 | C | 12 |
| 6 | 6 | 7 | 7 |
| 7 | 7 | 1A | 26 |
| 8 | 8 | 3 | 3 |
| 9 | 9 | 20 | 32 |
| 10 | A | D | 13 |
| 11 | B | 23 | 35 |
| 12 | C | 8 | 8 |
| 13 | D | 30 | 48 |
| 14 | E | 1B | 27 |
| 15 | F | 12 | 1B |
| 16 | 10 | 4 | 4 |
| 17 | 11 | 18 | 24 |
| 18 | 12 | 21 | 33 |
| 19 | 13 | 10 | 16 |
| 20 | 14 | E | 14 |
| 21 | 15 | 34 | 52 |
| 22 | 16 | 24 | 36 |
| 23 | 17 | 36 | 54 |
| 24 | 18 | 9 | 9 |
| 25 | 19 | 2D | 45 |
| 26 | 1A | 31 | 49 |
| 27 | 1B | 26 | 38 |
| 28 | 1C | 1C | 28 |
| 29 | 1D | 29 | 41 |
| 30 | 1E | 13 | 19 |
| 31 | 1F | 38 | 56 |
| 32 | 20 | 5 | 5 |
| 33 | 21 | 3E | 62 |
| 34 | 22 | 19 | 25 |
| 35 | 23 | B | 11 |
| 36 | 24 | 22 | 34 |
| 37 | 25 | 1F | 31 |
| 38 | 26 | 11 | 17 |
| 39 | 27 | 2F | 47 |
| 40 | 28 | F | 15 |
| 41 | 29 | 17 | 23 |
| 42 | 2A | 35 | 53 |
| 43 | 2B | 33 | 51 |
| 44 | 2C | 25 | 37 |
| 45 | 2D | 2C | 44 |
| 46 | 2E | 37 | 55 |
| 47 | 2F | 28 | 40 |
| 48 | 30 | A | 10 |
| 49 | 31 | 30 | 61 |
| 50 | 32 | 2E | 46 |
| 51 | 33 | 1E | 30 |
| 52 | 34 | 32 | 50 |
| 53 | 35 | 16 | 22 |
| 54 | 36 | 27 | 39 |
| 55 | 37 | 2B | 43 |
| 56 | 38 | 1D | 29 |
| 57 | 39 | 3C | 60 |
| 58 | 3A | 2A | 42 |
| 59 | 3B | 15 | 21 |
| 60 | 3C | 14 | 20 |
| 61 | 3D | 3B | 59 |
| 62 | 3E | 39 | 57 |
| 63 | 3F | 3A | 58 |

FIG.5

| INDEX $\ell$ | | VECTOR A | |
|---|---|---|---|
| DECIMAL | HEXADECIMAL | HEXADECIMAL | DECIMAL |
| 0 | 0 | 1 | 1 |
| 1 | 1 | 2 | 2 |
| 2 | 2 | 4 | 4 |
| 3 | 3 | 8 | 8 |
| 4 | 4 | 10 | 16 |
| 5 | 5 | 20 | 32 |
| 6 | 6 | 17 | 23 |
| 7 | 7 | 2E | 46 |
| 8 | 8 | B | 11 |
| 9 | 9 | 16 | 22 |
| 10 | A | 2C | 44 |
| 11 | B | F | 15 |
| 12 | C | 1E | 30 |
| 13 | D | 3C | 60 |
| 14 | E | 2F | 47 |
| 15 | F | 9 | 9 |
| 16 | 10 | 12 | 18 |
| 17 | 11 | 24 | 36 |
| 18 | 12 | 1F | 31 |
| 19 | 13 | 3E | 62 |
| 20 | 14 | 2B | 43 |
| 21 | 15 | 1 | 1 |
| 22 | 16 | 2 | 2 |
| 23 | 17 | 4 | 4 |
| 24 | 18 | 8 | 8 |
| 25 | 19 | 10 | 16 |
| 26 | 1A | 20 | 32 |
| 27 | 1B | 17 | 23 |
| 28 | 1C | 2E | 46 |
| 29 | 1D | B | 11 |
| 30 | 1E | 16 | 22 |
| 31 | 1F | 2C | 44 |
| 32 | 20 | F | 15 |
| 33 | 21 | 1E | 30 |
| 34 | 22 | 3C | 60 |
| 35 | 23 | 2F | 47 |
| 36 | 24 | 9 | 9 |
| 37 | 25 | 12 | 18 |
| 38 | 26 | 24 | 36 |
| 39 | 27 | 1F | 31 |
| 40 | 28 | 3E | 62 |
| 41 | 29 | 2B | 43 |
| 42 | 2A | 1 | 1 |
| 43 | 2B | 2 | 2 |
| 44 | 2C | 4 | 4 |
| 45 | 2D | 8 | 8 |
| 46 | 2E | 10 | 16 |
| 47 | 2F | 20 | 32 |
| 48 | 30 | 17 | 23 |
| 49 | 31 | 2E | 46 |
| 50 | 32 | B | 11 |
| 51 | 33 | 16 | 22 |
| 52 | 34 | 2C | 44 |
| 53 | 35 | F | 15 |
| 54 | 36 | 1E | 30 |
| 55 | 37 | 3C | 60 |
| 56 | 38 | 2F | 47 |
| 57 | 39 | 9 | 9 |
| 58 | 3A | 12 | 18 |
| 59 | 3B | 24 | 36 |
| 60 | 3C | 1F | 31 |
| 61 | 3D | 3E | 62 |
| 62 | 3E | 2B | 43 |

METHOD AND APPARATUS FOR DECODING ERROR CORRECTING CODE

BACKGROUND OF THE INVENTION

1. Field of the Invention

The present invention relates to a method and an apparatus for decoding an error correcting code, and more specifically, it relates to a method and an apparatus for decoding an error correcting code such as a BCH (Bose-Chaudhuri-Hocquenghem) code employed for detecting and correcting a bit error in received data in a digital data transmission system such as an automobile telephone system, a cordless telephone or satellite broadcasting.

2. Description of the Prior Art

In transmission of digital data, a bit error is generally caused by deterioration in the S-N ratio or distortion of the transmission system. In a general method of coping with such a bit error, redundant bits having error correcting ability (hereinafter referred to as error correcting bits) are previously added to original information bits, to be subjected to transmission. On the data sink side, a bit error position is detected on the basis of the received error correcting bits, to be corrected. Among such error correcting codes, the BCH code, having high error correcting ability with respect to length (bit number) of the correcting bits, is widely employed for transmission of a control signal in an automobile telephone system or a cordless telephone in Japan or U.S., or in a digital data transmission system such as PCM (pulse code modulation) audio broadcasting by satellite.

Description is briefly made on detection/correction of a bit error in transmission data through the BCH code. On the data source side, error correcting bits are obtained on the basis of original information bits and a prescribed generator polynominal G(X) to be added to the original information bits, and subjected to transmission. On the data sink side, a received signal train V(X) is divided by the said generator polynominal, thereby to find the remainder term S(X) thereof. This remainder term S(X) is hereinafter referred to as a syndrome. Presence/absence of a bit error is judged on the basis of the syndrome S(X), to detect the error position. Then bit error correction is performed by inverting the value of the bit corresponding to the detected error position.

FIG. 1 typically illustrates basic structure for data transmission in an automobile telephone system employing such a BCH code. Referring to FIG. 1, each terminal 1 is connected to a base station 3 through an exchange 2. High frequency radio communication in a scope of 800 to 900 MHz is performed between the base station 3 and a mobile station 4, while, in particular, control between the both stations such as origination, paging and channel switching is performed by transmission of digital signals. According to AMPS (advanced mobile phone service) specification for an automobile telephone system in the U.S., original information bits are transmitted with addition of the BCH code in transmission of digital signals for such control. In more concrete terms, according to the AMPS specification, a first control signal from the base station 3 to the mobile station 4 and a second control signal from the mobile station 4 to the base station 3 both employ the BCH code obtained on the basis of the original information bits and a generator polynominal $G(X)=X^{12}+X^{10}+X^8+X^5+X^4+X^3+1$. On the data source side, a bit train of zeros in a number equal to the degree of the generator polynominal (i.e., 12) is added to the original information bits so as to follow the least significant bit thereof. Then the original information bits with the bit train of zeros are divided by the generator polynominal G(X), to find the remainder R(X). This remainder R(X) is added to the original information bits so as to follow the least significant bit thereof, to be subjected to transmission.

According to the aforementioned AMPS specification, for example, the code length of the first control signal thus transmitted is 40 bits and the code length of the second control signal is 48 bits while minimum distance of codes is 5 in each case. Thus, it is possible to provide double-bit error correcting ability, while erroneous correction may be caused in this case. Therefore, the AMPS specification is restricted only to single-bit error correcting ability (primary correction), to improve ability for preventing erroneous correction.

In order to perform primary correction of the received data to which the BCH code is added, the received signal train V(X) is generally divided by the generator polynominal G(X) to first obtain the remainder term, i.e., the syndrome S(X). If the value of the syndrome S(X) is zero, i.e., when the received signal train V(X) is exactly divisible by the generator polynominal G(X), a judgement is made that no bit error is caused. On the other hand, if the value of the syndrome S(X) is not zero, i.e., when the received signal train V(X) is not divided out by the generator polynominal G(X), a judgement is made that a single-bit error or a multiple-bit error is caused in the process of data transmission. A ROM table storing previously calculated values of bit error positions corresponding to syndrome values in occurrence of single-bit errors is so prepared as to obtain the corresponding bit error position from the ROM table with the address of the obtained value of the syndrome S(X). Such technique is disclosed in Transactions of IECE Japan, Feb. 1979, Vol. J62-B No. 2, "Bit Error Rate Reduction Performance of BCH Codes and Self-Orthogonal Convolutional Codes" by K. Koga et al., for example.

According to the above described method, however, capacity required for the ROM is $2^k$ bytes assuming that k represents the degree of the generator polynominal (in the case of of code length of within 255 bits. If the code length exceeds 255 bits, the capacity is further increased). In the aforementioned AMPS specification, the degree of the generator polynominal is 12, and hence $2^{12}=4098$ bytes are required as the capacity for the ROM. On the other hand, the code length of the received signal is 48 bits even in the longer second control signal, and hence the number of error positions in occurrence of a primary error is 48.

Thus, according to the conventional error correcting method as hereinabove described, the required ROM capacity is too far increased as compared with the number of the primary error correcting positions, to deteriorate availability of the ROM.

SUMMARY OF THE INVENTION

Accordingly, the principal object of the present invention is to provide a method and an apparatus for decoding an error correcting code, which can reduce storage capacity required for error correction of a received signal train for improving memory availability.

Briefly stated, a received signal train V(X) is divided by a first primitive polynominal $G_1(X)$ and a second primitive polynominal $G_2(X)$ found by factoring a generator polynominal $G(X)$, to first obtain corresponding syndromes $S_1(X)$ and $S_2(x)$. It is assumed here that both of the primitive polynominals $G_1(X)$ and $G_2(X)$ are polynominals of degree m (m: positive integer) and the cycle of the syndrome $S_2(X)$ obtained by dividing the signal train $V(X)$ including a single-bit error by $G_2(X)$ is 1/n (n: positive integer) times the cycle of the syndrome $S_1(X)$ obtained by dividing the same signal train $V(X)$ by $G_1(X)$. Then, a single-bit error position l of the signal train $V(X)$ is obtained on the basis of the calculated syndrome $S_1(X)$. Among the values of the syndrome $S_2(X)$ corresponding to the single-bit errors, a particular syndrome $S_2'(X)$ corresponding to the above calculated single-bit error position l is obtained to be compared with the syndrome $S_2(X)$ actually calculated by $V(X)/G_2(X)$. A judgement is made that the received signal train $V(X)$ includes a single-bit error upon coincidence of the syndromes as the result of comparison, while a judgement is made that the received signal train $V(X)$ includes a double-bit or multiple-bit error upon non-coincidence.

Thus, the principal advantage of the present invention is that the error position is calculated on the basis of the syndrome $S_1(X)$ obtained by dividing the received signal train $V(X)$ by the first primitive polynominal $G_1(X)$ resulting from factorization of the generator polynominal $G(X)$ to judge whether or not the error is a primary error by comparing the syndrome $S_2'(X)$ corresponding to the error position with the syndrome $S_2(X)$ actually calculated by $V(X)/G_2(X)$, whereby the required storage capacity can be extremely reduced as compared with the conventional error correcting method.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a table showing relation between single-bit error positions and values of a syndrome $S_1(X)$;

FIG. 4 is a table showing relation between the values of the syndrome $S_1(X)$ and the single-bit error positions;

FIG. 5 is a table showing relation between single-bit error positions and values of a syndrome $S_2(X)$;

DESCRIPTION OF THE PREFERRED EMBODIMENT

Figure 1:
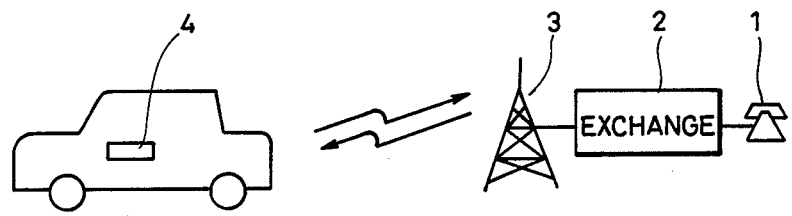
FIG. 1 is a typical diagram showing basic structure for data transmission in an automobile telephone system employing a BCH code.
Figure 2:
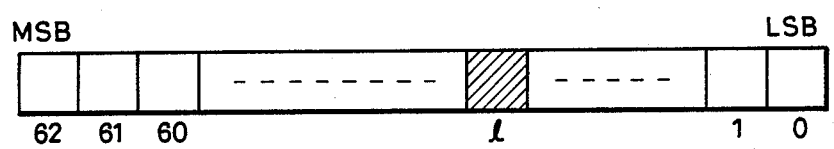
FIG. 2 illustrates a received signal train of 63 bits.

Description is now made on the principle of the present invention The present invention basically employs primitive polynominals $G_1(X)$ and $G_2(X)$ found by factoring a generator polynominal $G(X)$ to obtain syndromes $S_1(X)$ and $S_2(X)$ for the respective primitive polynominals, thereby to perform bit error judgement on a received signal train. The following description is made on error correction employing the generator polynominal $G(X)=X^{12}+X^{10}+X^8+X^5+X^4+X^3+1$ according to the aforementioned AMPS specification and primitive polynominals $G_1(X)=X^6+X+1$ and $G_2(X)=X^6+X^4+X^2+X+1$, which are found by factoring the generator polynominal $G(X)$. A bit train of 63 bits in code length is considered as a received signal train. FIG. 2 illustrates such a received signal train of 63 bits, in which symbol l denotes a primary error bit position (hereinafter referred to as an index).

FIG. 3 is a table showing relation between values of the aforementioned index l, i.e., single-bit error positions and values of the remainder term resulting from division of the received signal train $V(X)$ of 63 bits by the aforementioned first primitive polynominal $G_1(X)=X^6+X+1$, i.e., the syndrome $S_1(X)$ (hereinafter referred to as vector A). Referring to FIG. 3, the leftmost column shows the indices l in decimal notation and the second column shows the indices l in hexadecimal notation while the third column shows the values of the vector A in hexadecimal notation and the fourth column shows the values of the vector A in decimal notation.

As obvious from FIG. 3, the indices l and the values of the vector A are in one-to-one correspondence to each other within a range of $0 \leq l \leq 62$. In other words, the values of the syndrome $S_1(X)$ and the primary error positions are in one-to-one correspondence to each other with respect to the first primitive polynominal $G_1(X)=X^6+X+1$ resulting from factorization of the generator polynominal $G(X)$.

FIG. 4 illustrates correspondence/relation of the indices l to the vector A obtained by transforming the relation of the vector A to the indices l as shown in the table of FIG. 3. Referring to FIG. 4, the leftmost column shows the values of the vector A in decimal notation and the second column shows the values of the vector A in hexadecimal notation, while the third column shows the indices l in hexadecimal notation and the fourth column shows the indices l in decimal notation. A ROM table of the correspondence/relation as shown in FIG. 4 is previously provided to be stored in a ROM 1. Thus, the corresponding single-bit error position l can be obtained from the ROM 1 with the address of the value of the syndrome $S_1(X)$ found by dividing the received signal train $V(X)$ by the first primitive polynominal $G_1(X)=X^6+X+1$.

FIG. 5 is a table showing relation between the aforementioned indices l, i.e., the single-bit error positions and the values of the remainder term resulting from division of the received signal train $V(X)$ of 63 bits by the aforementioned second primitive polynominal $G_2(X)=X^6+X^4+X^2+X+1$, i.e., the syndrome $S_2(X)$ (vector A). Referring to FIG. 5, the leftmost column shows the indices l in decimal notation and the second column shows the indices l in hexadecimal notation, while the third column shows the values of the vector A in hexadecimal notation and the fourth column shows the values of the vector A in decimal notation.

As obvious from FIG. 5, the values of the vector A repeat in the cycle of 21. When, for example, the vector A, i.e., the syndrome $S_2(X)$ is 10 in decimal notation, there are three corresponding indices l, i.e., primary error positions of 4, 25 and 46 in decimal notation. In general, three primary error positions correspond to the syndrome $S_2(X)$, which is not in one-to-one correspondence to the error positions l.

In the case of the primary error, an index corresponding to the syndrome $S_1(X)$, i.e., an error position $l_0$ certainly coincides with one of three error positions $l_1$, $l_2$ and $l_3$ corresponding to the syndrome $S_2(X)$.

Such coincidence is not established in the case of a secondary or tertiary error. Thus, the aforementioned coincidence is judged to enable a determination as to whether a bit error of a received signal train is a primary error or a secondary or tertiary error.

Description is now made on a method of judging whether or not an error position corresponding to the syndrome $S_1(X)$ coincides with one of three error positions corresponding to the syndrome $S_2(X)$. Since there are three corresponding error positions for each value of the syndrome $S_2(X)$, the procedure of such judgement is extremely complicated in the method of utilizing the above ROM table 1 (FIG. 4) for obtaining the corresponding error position with the address of the syndrome. According to the present invention, therefore, the index l obtained from the above ROM table 1 with the address of the syndrome $S_1(X)$ for indicating the error position is further employed as the address for obtaining a corresponding vector A, i.e., a syndrome $S_2'(X)$ from a ROM table 2 of the correspondence/relation as shown in FIG. 5. A judgement is made on coincidence of the syndrome $S_2'(X)$ obtained from the ROM table 2 and the syndrome $S_2(X)$ obtained by dividing the received signal train $V(X)$ by the second primitive polynominal $G_2(X)$. Primary error correction is performed upon coincidence of the syndromes, while predetermined processing is made with a judgement on a secondary error or an error of higher degree upon noncoincidence.

With reference to the primary error case, it is assumed here that an error occurs in a bit position of index l=20 (decimal notation)=14 (hexadecimal notation). In this case, the syndrome $S_1(X)$ obtained by dividing the received signal train $V(X)$ by the first primitive polynominal $G_1(X)$ is 3C (hexadecimal notation) from the table of FIG. 3. Therefore, the error position l obtained from the ROM table 1 of FIG. 4 with the address of the syndrome 3C is 14 (hexadecimal notation). Further, the syndrome $S_2'(X)$ obtained from the ROM table 2 of FIG. 5 with the address of l=14 (hexadecimal notation) is 2B (hexadecimal notation). On the other hand, the syndrome $S_2(X)$ obtained by dividing the received signal train $V(X)$ by the second primitive polynominal $G_2(X)$ is 2B (hexadecimal notation) from the table of FIG. 5. Thus, $S_2(X)=S_2'(X)=2B$, i.e., the syndrome $S_2(X)$ coincides with the output of the ROM 2.

With reference to the secondary error case, it is assumed here that the bit error occurs in indices l=20 (decimal notation) and l=40 (decimal notation). In this case, the syndrome $S_1(X)$ obtained by dividing the received signal train $V(X)$ by the first primitive polynominal $G_1(X)$ is an added value of a vector $A_{20}$ corresponding to l=20 in FIG. 3 and a vector $A_{40}$ corresponding to l=40 by MOD2. Namely, $A_{20}$=3C (hexadecimal notation)=00111100 (binary notation) and $A_{40}$=2F (hexadecimal notation)=00101111 (binary notation) from the table of FIG. 3, and the added value of the same by MOD2, i.e., the syndrome $S_1(X)$ is 00010011 (binary notation)=19 (decimal notation)=13 (hexadecimal notation). Therefore, an error position l obtained from the ROM table 1 of FIG. 4 with the address of the syndrome 13 (hexadecimal notation) is 10 (hexadecimal notation)=16 (decimal notation). Further, the syndrome $S_2'(X)$ obtained from the ROM table 2 of FIG. 5 with the address of l=10 (hexadecimal notation) is 12 (hexadecimal notation). On the other hand, the syndrome $S_2(X)$ obtained by dividing the received signal train $V(X)$ by the second primitive polynominal $G_2(X)$ is an added value of the vector $A_{20}$ corresponding to l=20 and the vector $A_{40}$ corresponding to l=40 in FIG. 5 by MOD2. Namely, $A_{20}$=2B (hexadecimal notation)=00101011 (binary notation) and $A_{40}$=3E (hexadecimal notation)=00111110 (binary notation) from the table of FIG. 5, and the added value of the same by MOD2, i.e., the syndrome $S_2(X)$ is 00010101 (binary notation)=21 (decimal notation)=15 (hexadecimal notation). Thus, $S_2(X)$=15 (hexadecimal notation)$\neq S_2'(X)$=12 (hexadecimal notation) where the syndrome $S_2(X)$ is not in coincidence with the output of the ROM 2. Thus, judgement is made on a secondary error or an error of higher degree, to perform no correction processing.

Since the minimum distance of codes d of the generator polynominal $G(X)$ is equal to 5, the syndrome $S_2(X)$ may coincide with the output of the ROM 2 upon occurrence of a quarternary error, which may possibly be judged as a primary error. In general, however, a quarternary error or an error of higher degree rarely occurs and hence correction thereof with the judgement of a primary error causes no problem in practice.

As hereinabove described, the ROM capacity required in the present invention is 63 bytes for the ROM 1 as shown in FIG. 4 and 63 bytes for the ROM 2 as shown in FIG. 5, i.e., 126 bytes in total. Thus, the required ROM capacity can be extremely reduced as compared with the conventional error correcting method.

Figure 6:
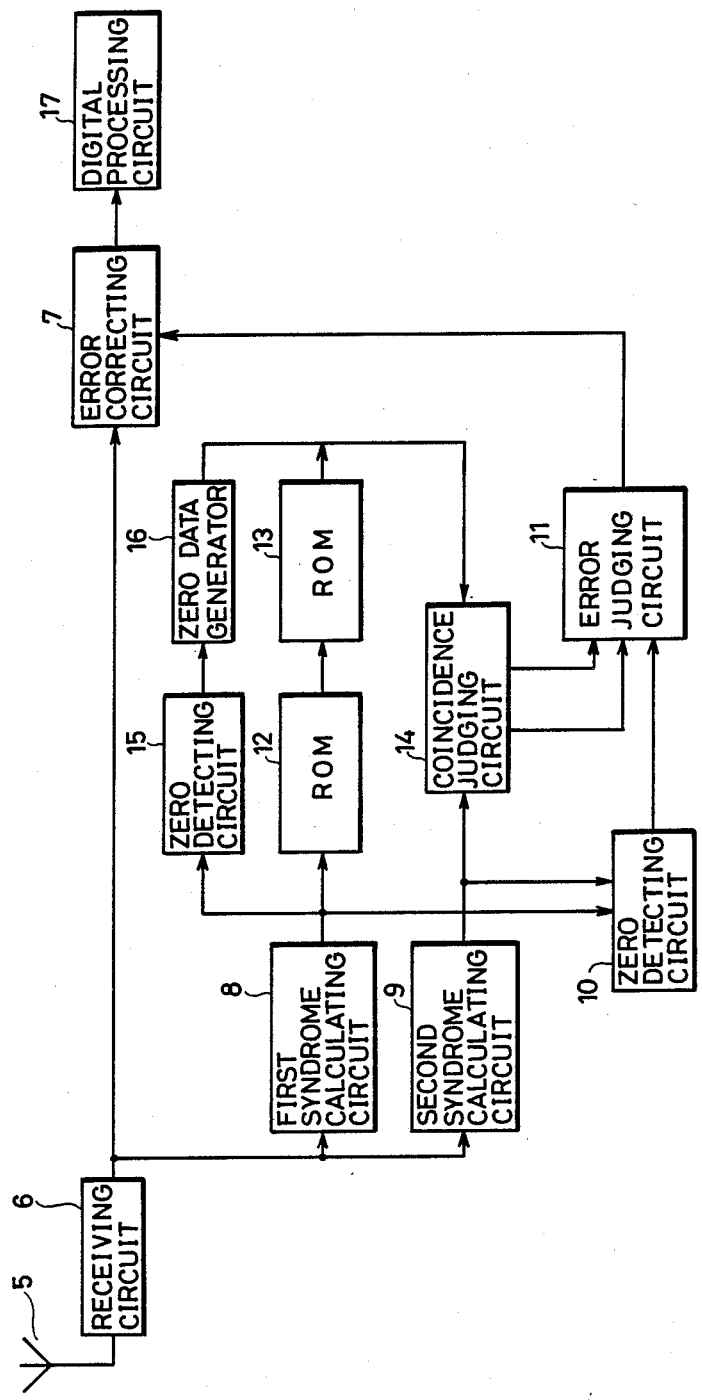
FIG. 6 is a schematic block diagram showing an error correcting code decoding apparatus according to an embodiment of the present invention.

FIG. 6 is a schematic block diagram showing an embodiment of a decoding circuit for carrying out such an error correcting code decoding system according to the present invention. Referring to FIG. 6, transmit data to which an error correcting code is added in a data source side (not shown) are received by a receiving antenna 5 and a receiving circuit 6. A received signal train $V(X)$ is supplied to an error correcting circuit 7, as well as to a first syndrome calculating circuit 8 which divides the received signal train $V(X)$ by a first primitive polynominal $G_1(X)=X^6+X+1$ to calculate a syndrome $S_1(X)$, being the remainder term, and a second syndrome calculating circuit 9 which divides the received signal train $V(X)$ by a second primitive polynominal $G_2(X)=X^6+X^4+X^2+X+1$ to calculate a syndrome $S_2(X)$, being the remainder term.

Figure 7:
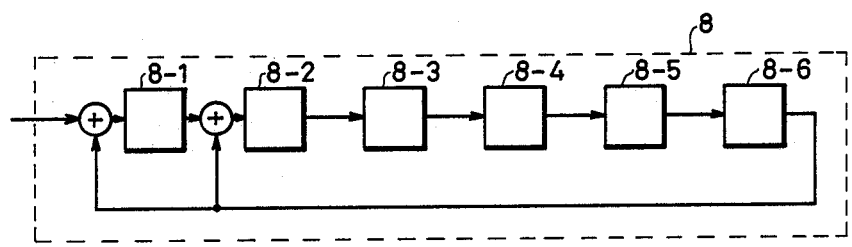
FIG. 7 is a block diagram for illustrating a first syndrome calculating circuit 8 as shown in FIG. 6 in detail.
Figure 8:
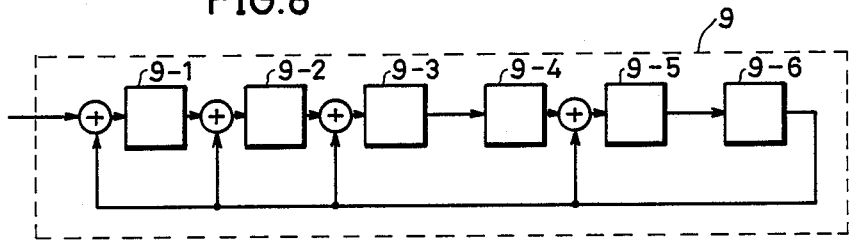
FIG. 8 is a block diagram for illustrating a second syndrome calculating circuit 9 as shown in FIG. 6 in detail.

FIG. 7 is a circuit diagram for illustrating the first syndrome calculating circuit 8 in detail. The substance of this circuit 8 is a dividing circuit for dividing the received signal train $V(X)$ by the first primitive polynominal $G_1(X)=1+X+X^6$, which is formed by series-connected shift registers 8-1, 8-2, ..., 8-6. Inputting coefficients of the received signal train $V(X)$ in an input terminal of the circuit 8 bit by bit sequentially from a term of higher degree, contents remaining in the respective shift registers 8-1 to 8-6 upon input of the final bit are coefficients of the remainder term to be found, while the content of the rightmost shift register 8-6 is the coefficient of the term of highest degree of the remainder polynominal $S_1(X)$. Similarly, FIG. 8 is a circuit diagram for illustrating the second syndrome calculating circuit 9 in detail. The substance of this circuit 9 is a dividing circuit for dividing the received signal train V(X) by the second primitive polynominal $G_2(X)=1+X+X^2+X^4+X^6$, which is formed by series-connected shift registers 9-1, 9-2, ..., 9-6. The principle of operation of this circuit 9 is identical to that of the first circuit 8.

If the received signal train V(X) includes no bit error, both of the syndromes $S_1(X)$ and $S_2(X)$ calculated by the syndrome calculating circuits 8 and 9 as hereinabove described are zero. A first zero detecting circuit 10 receives outputs from the circuits 8 and 9 to detect $S_1(X)=S_2(X)=0$ and informs an error judging circuit 11 of the detection.

When, on the other hand, the input signal train V(X) includes a bit error, the syndrome $S_1(X)$ outputted from the first syndrome calculating circuit 8 is supplied to a first ROM 12 storing the ROM table 1 as shown in FIG. 4. A primary error position l is obtained from the first ROM 12 with the address of the syndrome $S_1(X)$ and outputted. This error position l is supplied to a second ROM 13 storing the ROM table 2 as shown in FIG. 5. A syndrome $S_2'(X)$ is obtained from the second ROM 13 with the address of the error position l and outputted. The syndrome $S_2(X)$ outputted from the second syndrome calculating circuit 9 and the syndrome $S_2'(X)$ outputted from the second ROM 13 are supplied to a coincidence judging circuit 14, which in turn judges coincidence of the syndromes $S_2(X)$ and $S_2'(X)$. Namely, the coincidence judging circuit 14 makes a judgement on a primary error if $S_2(X)=S_2'(X)$ while making a judgement of a secondary error or an error of higher degree if $S_2(X)\neq S_2'(X)$, to inform the error judging circuit 11 of the result of judgement.

It may be considered that only the syndrome $S_1(X)$ outputted from the first syndrome calculating circuit 8 is zero. In such case, the table of the ROM 12 (FIG. 4) stores no corresponding error position data. Thus, the syndrome $S_1(X)$ of zero is detected by a second zero detecting circuit 15, and a zero data generator 16 is driven to supply prescribed zero data to the coincidence judging circuit 14, so that the coincidence judging circuit 14 responsively makes a judgement on non-coincidence.

In response to outputs from the first zero detecting circuit 10 and the coincidence judging circuit 14, the error judging circuit 11 makes a judgement on no bit error, primary error or secondary or higher degree error, to supply the result to the error correcting circuit 7. When a judgement of no bit error is made, the received signal train V(X) supplied from the receiving circuit 6 to the error correcting circuit 7 is directly supplied to a digital processing circuit 17 of a subsequent stage to be subjected to prescribed signal processing. When a judgement of primary error is made, the error correcting circuit 7 corrects the corresponding bit error of the received signal train V(X) to supply the same to the digital processing circuit 17. When a judgement of secondary or higher degree error is made, the error correcting circuit 7 performs processing such has correction or disregarding of the received signal.

According to the embodiment of the present invention as hereinabove described, the storage capacity required for error correction can be extremely reduced.

Although the above description of the preferred embodiment has been made on the case of employing the BCH error correcting code of the generator polynominal $G(X)=X^{12}+X^{10}+X^8+X^5+X^4+X^3+1$, the present invention is not restricted to such a BCH code. The present invention is widely applicable to an error correcting system employing a generator polynominal which is formed by a first primitive polynominal having a constant first cycle and a second primitive polynominal having a second cycle of 1/n thereof.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An error correcting code decoding apparatus comprising:
   means for receiving a digital signal train V(X) added with an error correcting code on the basis of a generator polynominal G(X) formed by a first primitive polynominal $G_1(X)$ and a second primitive polynominal $G_2(X)$;
   first syndrome calculating means for dividing said received signal train V(X) by said first primitive polynominal $G_1(X)$ to obtain a syndrome $S_1(X)$, being the remainder term, said first primitive polynominal $G_1(X)$ being a polynominal of degree m (m: positive integer), said syndrome $S_1(X)$ being obtained by dividing said signal train V(X), including a single-bit error, by said first primitive polynominal $G_1(X)$ being in a cycle of $2^m-1$;
   second syndrome calculating means for dividing said received signal train V(X) by said second primitive polynominal $G_2(X)$ to obtain an actual syndrome $S_2(X)$, being the remainder term, said second primitive polynominal $G_2(X)$ being a polynominal of said degree m, said actual syndrome $S_2(X)$ being obtained by dividing said signal train V(X), including said single-bit error, by said second primitive polynominal $G_2(X)$ being in a cycle of $(2^m-1)/n$ (n: positive integer);
   error position calculating means for obtaining a single-bit error position l of said received signal train on the basis of said syndrome $S_1(X)$ obtained by said first syndrome calculating means;
   means for obtaining an assumed syndrome $S_2'(X)$ corresponding to said single-bit error position l calculated by said error position calculating means among values of said actual syndrome $S_2(X)$ corresponding to single-bit errors;
   means for comparing said actual syndrome $S_2(X)$ outputted from said second syndrome calculating means with said assumed syndrome $S_2'(X)$; and
   means for judging that said received signal train V(X) includes said single-bit error upon coincidence of said actual syndrome $S_2(X)$ with said assumed syndrome $S_2'(X)$ while judging that said received signal train V(X) includes a double-bit error or a multiple-bit error upon non-coincidence as the result of comparison by said comparing means.

2. An error correcting code decoding apparatus in accordance with claim 1, further comprising means for correcting said single-bit error when said judging means judges that said received signal train V(X) includes said single-bit error.

3. An error correcting code decoding apparatus in accordance with claim 2, further comprising means for detecting a case such that both of said syndrome $S_1(X)$ outputted from said first syndrome calculating means and said actual syndrome $S_2(X)$ outputted from said second syndrome calculating means are zero so as to judge that no bit error occurs in said received signal train V(X).

4. An error correcting code decoding apparatus in accordance with claim 3, further comprising means for detecting a case such that only said syndrome $S_1(X)$ outputted from said first syndrome calculating means is zero to generate prescribed zero data and for supplying the same to said comparing means.

5. An error correcting code decoding apparatus in accordance with claim 1, wherein
each of said first and second syndrome calculating means is formed by series-connected m-stage shift registers.

6. An error correcting code decoding apparatus in accordance with claim 1, wherein
said error position calculating means is a first memory storing a translation table for obtaining said single-bit error position l with respect to said syndrome $S_1(X)$.

7. An error correcting code decoding apparatus in accordance with claim 6, wherein
said means for obtaining said assumed syndrome $S_2'(X)$ is a second memory storing a translation table for obtaining said assumed syndrome $S_2'(X)$ with respect to said single-bit error position.

8. An error correcting code decoding apparatus in accordance with claim 1, wherein
said error correcting code is a BCH code.

9. An error correcting code decoding apparatus in accordance with claim 8, wherein
said first primitive polynominal $G_1(X)$ is equal to $X^6+X+1$,
said second primitive polynominal $G_2(X)$ is equal to $X^6+X^4+X^2+X+1$, and
said generator polynominal $G(X)$ is equal to $X^{12}+X^{10}+X^8+X^5+X^4+X^3+1$.

10. An error correcting code decoding method comprising the steps of:
a first step of receiving a digital signal train V(X) added with an error correcting code on the basis of a generator polynominal G(X) formed by a first primitive polynominal $G_1(X)$ and a second primitive polynominal $G_2(X)$;
a second step of dividing said received signal train V(X) by said first primitive polynominal $G_1(X)$ to obtain a syndrome $S_1(X)$, being the remainder term, said first primitive polynominal $G_1(X)$ being a polynominal of degree m (m: positive integer), said syndrome $S_1(X)$ being obtained by dividing said signal train V(X), including a single-bit error, by said first primitive polynominal $G_1(X)$ being in a cycle of $2^m-1$;
a third step of dividing said received signal train V(X) by said second primitive polynominal $G_2(X)$ to obtain an actual syndrome $S_2(X)$, being the remainder term, said second primitive polynominal $G_2(X)$ being a polynominal of degree m, said actual syndrome $S_2(X)$ being obtained by dividing said signal train V(X), including said single-bit error, by said primitive polynominal $G_2(X)$ being in a cycle of $(2^m-1)/n$ (n: positive integer;
a fourth step of obtaining a single-bit error position l of said received signal train on the basis of said syndrome $S_1(X)$ obtained by said second step;
a fifth step of obtaining an assumed syndrome $S_2'(X)$ corresponding to said single bit error position l calculated in said fourth step among values of said actual syndrome $S_2(X)$ corresponding to single-bit errors;
a sixth step of comparing said actual syndrome $S_2(X)$ obtained in said third step with said assumed syndrome $S_2'(X)$; and
a seventh step of judging that said received signal train V(X) includes said single-bit error l upon coincidence of said actual syndrome $S_2(X)$ with said assumed syndrome $S_2'(X)$ while judging that the same includes a double-bit error or a multiple-bit error upon non-coincidence as the result of comparison in said sixth step.

11. An error correcting code decoding method in accordance with claim 10, further comprising an eighth step of correcting said single-bit error when a judgement is made that said received signal train V(X) includes said single-bit error in said seventh step.

12. An error correcting code decoding method in accordance with claim 11, further comprising a ninth step of detecting such case that both of said syndrome $S_1(X)$ calculated in said second step and said actual syndrome $S_2(X)$ calculated in said third step are zero to judge that no bit error occurs in said signal train V(X).

13. An error correcting code decoding method in accordance with claim 12, further comprising a tenth step of detecting case such that only said syndrome $S_1(X)$ as calculated in said second step is zero to generate prescribed zero data and comprising the same with said actual syndrome $S_2(X)$ as calculated in said third step.

14. An error correcting code decoding method in accordance with claim 10, wherein
said error correcting code is a BCH code.

15. An error correcting code decoding method in accordance with claim 14, wherein
said first primitive polynominal $G_1(X)$ is equal to $X^6+X+1$,
said second primitive polynominal $G_2(X)$ is equal to $X^6+X^4+X^2+X+1$, and
said generator polynominal $G(X)$ is equal to $X^{12}+X^{10}+X^8+X^5+X^4+X^3+1$.

* * * * *